United States Patent [19]

Cusack

[11] Patent Number: 4,875,138
[45] Date of Patent: Oct. 17, 1989

[54] VARIABLE PITCH IC BOND PAD ARRANGEMENT

[75] Inventor: Michael D. Cusack, Monument, Colo.

[73] Assignee: United Technologies Corporation, Hartford, Conn.

[21] Appl. No.: 210,900

[22] Filed: Jun. 24, 1988

Related U.S. Application Data

[63] Continuation-in-part of Ser. No. 920,632, Oct. 20, 1986, Pat. No. 4,753,820.

[51] Int. Cl.⁴ .......................................... H05K 01/18
[52] U.S. Cl. ................................. 174/52.4; 357/70; 361/392; 361/400; 361/405
[58] Field of Search ............... 361/400, 403, 405, 392; 174/52.4; 357/70

[56] References Cited

U.S. PATENT DOCUMENTS

| | | | |
|---|---|---|---|
| 4,003,073 | 1/1977 | Helda et al. | 357/70 |
| 4,366,342 | 12/1982 | Breedlove | 174/52.4 |
| 4,513,355 | 4/1985 | Schroeder | 174/52.4 X |
| 4,725,692 | 2/1988 | Ishii et al. | 174/52.4 |
| 4,733,462 | 3/1988 | Kawatani | 361/405 X |
| 4,753,820 | 6/1988 | Cusak | 174/52.4 X |

Primary Examiner—R. R. Kucia
Attorney, Agent, or Firm—Edward L. Kochey, Jr.

[57] ABSTRACT

The bond pads (22) for a ceramic package (10) are deposited on the pre-fired ceramic at variable pitch with the bond pad widths (47) increasing as a function of the distance (49) of each pad from an alignment point (40), whereby bond pads at the extremity (36) of the package have the largest pad width and pads toward the alignment point (40) of the package have the narrowest width.

7 Claims, 4 Drawing Sheets

VARIABLE PITCH IC BOND PAD ARRANGEMENT

This is a continuation-in-part of application Ser. No. 920,632, filed Oct. 20, 1986 now U.S. Pat. No. 4,753,820 granted June 28, 1988.

TECHNICAL FIELD

This invention relates to integrated circuit (IC) packaging, and more particularly to ceramic IC packages.

BACKGROUND ART

The manufacture of ceramic microelectronic packages by the co-firing process involves deposition of trace refractory metalization on the unfired, or "green" tape cast of the ceramic IC carrier. The trace metal represents the package bond pads which the IC die leads attach to. The firing of the green tape shrinks the ceramic to a final, post-fired size. The shrinkage is predictable (on the order of 18%) to within a $+/-$ "acceptable variation" tolerance. The standard variation tolerance is $+/-1.0\%$ of the nominal post-fired ceramic body dimension.

The trace metal being in the ceramic also shrinks predictably when the ceramic is fired, with the same $+/-1.0\%$ variation tolerance on size and geometrical spacing. If a first array of trace line metal is deposited on the green tape ceramic and is intended for post-fired registration with a second array of trace metal having a nominal dimension of 1.0 inches, then the final dimension of the first array may be $1.000+/-0.010$ inches.

Prior art methods of mounting the IC dies to the ceramic package bond pads include both manual and automated bonding processes. In the manual processes the electrical interconnection of the IC to the package require operator alignment of the IC interconnect wires (or ribbon) to the bond pads. After alignment a bonder machine secures the device leads to the bond pads by welding or soldering. Automated processes, such as tape automated bonding (TAB), require accurate positioning of the package bond pads so as to automatically receive the IC TAB leads in register. The $+/-1.0\%$ shrinkage tolerance creates problems with the TAB leads to bond pad registration.

While the bond pads may be made large enough to accommodate all manufacturing tolerances, including the shrinkage tolerance, this prevents increasing package density. The IC industry drive towards miniaturization requires high density packaging which prohibits this brute force method of lead registration.

DISCLOSURE OF THE INVENTION

The object of the present invention is to provide a method of designing the widths of the bond pad trace metalization deposited on a pre-fired ceramic package so as to ensure automatic post-fired registration of the package bond pads with the IC device TAB leads.

According to the present invention, the bond pad metalization for a ceramic package is deposited on the pre-fired ceramic with the bond pad widths increasing as a function of the distance of each pad from the center of package mass toward which the ceramic shrinkage takes place, whereby bond pads at the extremity of the package have the largest pad width and pads toward the center of the package have the narrowest width.

With the present invention, the widths of the package bond pads which are furthest from the center of package mass are made wider than those pads closest to the center. The greater the distance from the center of mass, the greater the effect of the feature displacement due to the $+/-1.0\%$ tolerance. Since the furthest bond pads experience the greatest shrinkage tolerance variation and resultant feature displacement, increasing their width ensures their registration with the IC TAB leads under the worst case conditions of the post-fired tolerance. Similarly the bond pads closest to the center of package mass are deposited with the smallest widths. Since the closer pads experience the minimum shrinkage tolerance variation, and resultant minimum feature displacement, the narrower widths still ensure registration with the IC leads. Instead of making all of the bond pads uniformly wide the actual width of each pad varies with the pad's location from the package center of mass.

The present invention accommodates the fact that ceramic shrinkage with firing is not constant across the ceramic body. Instead, the different areas of the ceramic body shrink by a percentage dependent on the distance of the area from the center of mass. The amount of shrinkage is greater at the periphery, and decreases from the outer edges towards the center of the body in a more or less predetermined fashion, subject to the $+/-1.0\%$ tolerance.

BEST MODE FOR CARRYING OUT THE INVENTION

Figure 2:
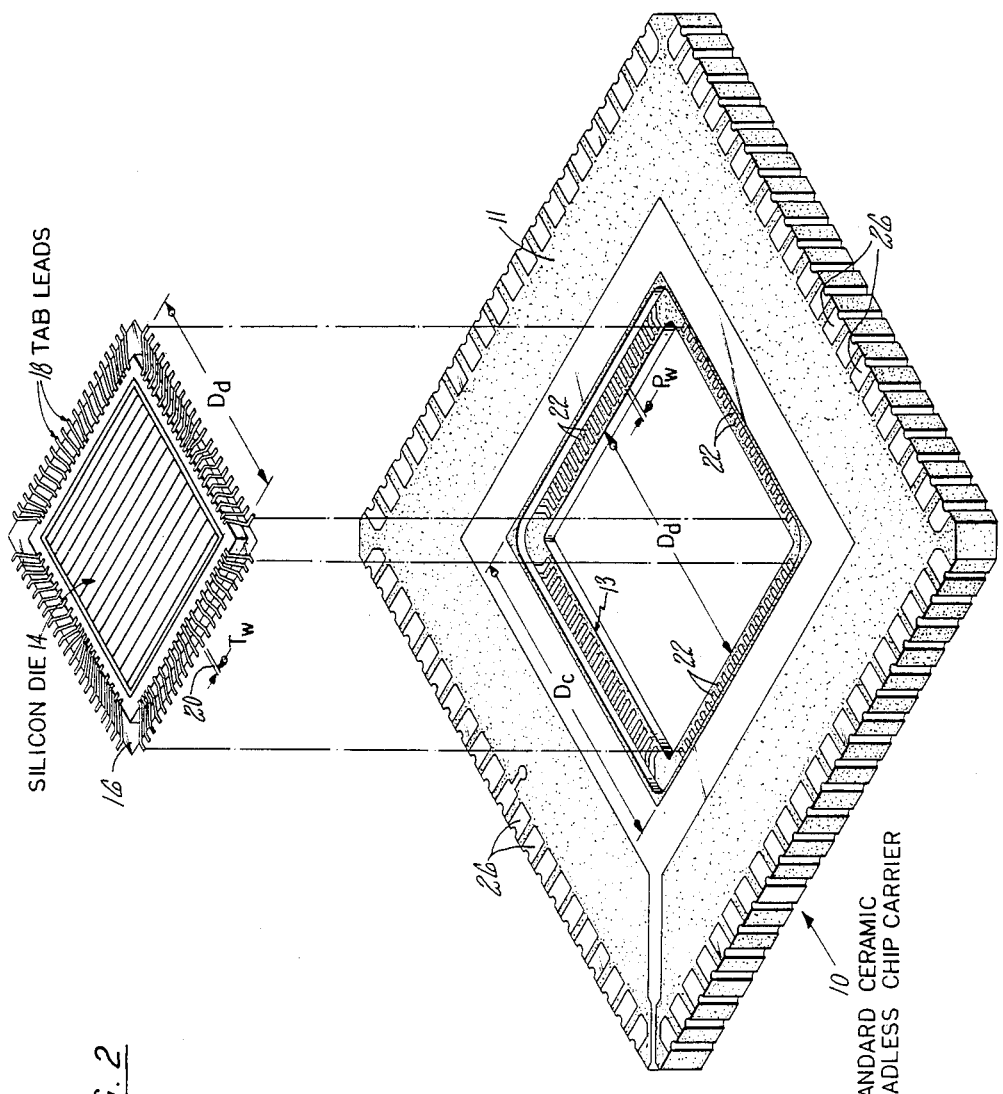
FIG. 2 is a perspective illustration of the mounting relationship between an IC device and the ceramic package of FIG. 1.

FIG. 2 illustrates a standard, leadless ceramic package (chip carrier) 10 in which the present invention may be used. The package includes a substrate 11, having a symmetrical central cavity 12. The cavity is stepped, to provide a bond shelf 13 having an outer dimension Dc and an inner dimension $D_d$. The Dd dimension is larger than that of a silicon IC die 14 to be mounted in the package. The die is mounted to a tape 16 using a tape automated bonding (TAB) process known in the art. The tape connects the die terminals to input/output (I/O) TAB leads 18. The TAB leads have a lead width $(T_w)$ 20.

The tape-mounted die is fitted into the lower part of the cavity, with registration of the IC TAB leads 18 to the package bond pads 22 arrayed along the bond pad shelf 13; on all four sides of the cavity 12. The TAB leads are welded, or soldered to the package bond pads. The bond pads 22 are connected (not shown) through the substrate 11 to corresponding outer bond pads 26, which allow connection of the IC to user equipment outside the package.

The IC TAB process, the fabrication of the ceramic package, the deposition of the bond pad metalization, and the mounting of the IC to the package, are all accomplished through known, prior art methods. The bond pads may be deposited using any one of a number of known deposition techniques, i.e. photolithographic deposition. They are not a part of the present invention. The present invention relates to the method of calculating the finished post-fired pad width (PAD_W) of each of the shelf bond pads 22 so that in the postfired ceramic each of the bond pads provide sufficient pad surface contact in register with the TAB leads to allow automated bonding.

Figure 1:
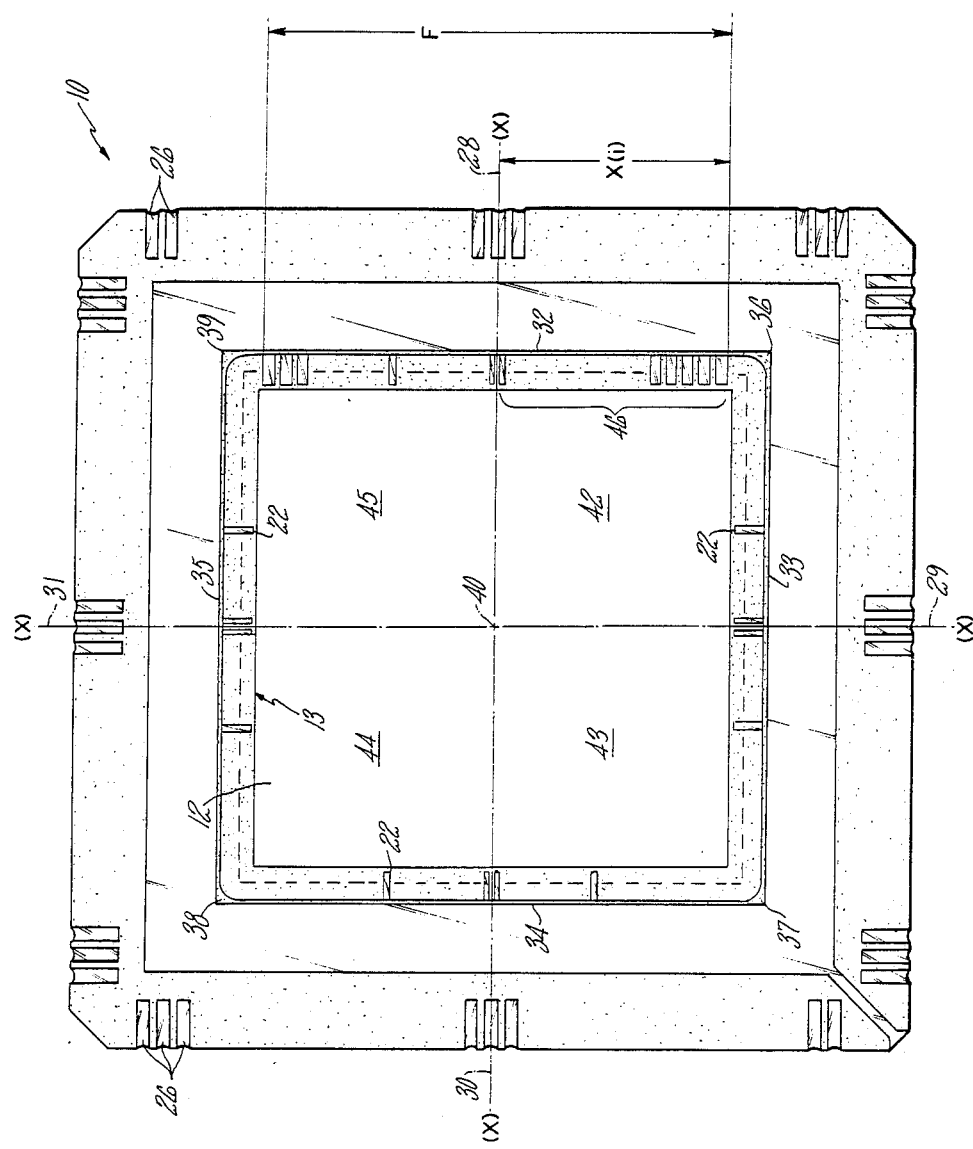
FIG. 1 is a plan view of a ceramic package in which the present invention may be used.

FIG. 1 is a plan view of the ceramic package 10 of FIG. 2. Bond pad metalization is deposited on all four sides of the cavity shelf 13. In the present invention, the bond pads are deposited such that the PAD_W values of the pads disposed closest to centers (X) 28-31 of each side 32-35 have a minimum width, and the pads at the extreme corners 36-39 of each side have a maximum width. The sides are symmetrical about the center of mass 40 of the ceramic carrier. The centers 28-31 are also the center of symmetry of the sides about the center of mass, as shown by the orthogonal X axes emanating from the center. The X axes divide the package surface into four quadrants 42-45.

The length of the bond pad array on each side is specified by a bond pad centerline spread feature size F for each side, as illustrated for the side 32. The PAD_W widths of the pads over the feature size F are symmetrical about the centers (X) 28-31 of each side. Therefore, the variation of PAD_W from minimum to maximum occurs over one-half the feature size (F/2). By determining the PAD_W pattern over the length F/2 for a one-half segment of a side (e.g., the segment 46 of side 32), the pad pattern may be replicated eight times.

Figure 3:
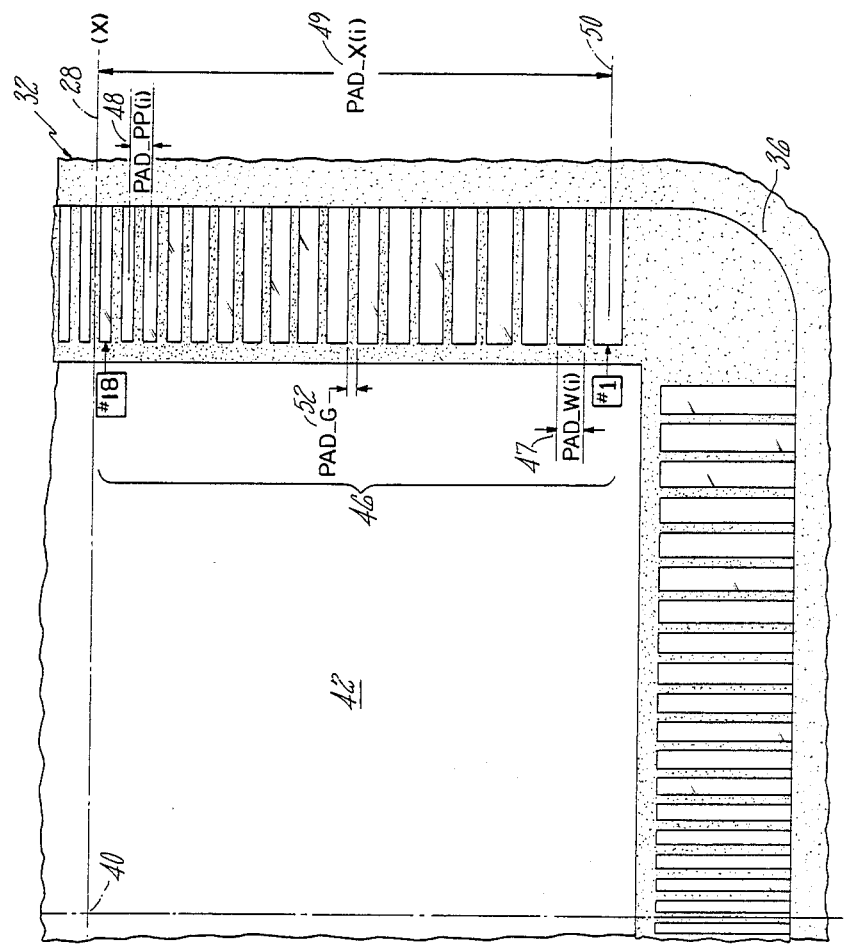
FIG. 3 is an illustration of a portion of an array of bond pad metalization deposited by the method of the present invention on the ceramic package of FIG. 1.

FIG. 3 illustrates the quadrant 42 with the segment 46 of side 32. The embodiment of the present method is described with respect to a ceramic package having a total of 144 bond pads. There are 36 pads per side, with 18 pads for each F/2 segment. As shown for segment 46 the pads are numbered from #1 at the corner 36 to #18 at the center 28.

There are three parameters which must be calculated for each of the pads in the F/2 segment array. These include: the pad width (PAD_W(i)) 47 (where (i) is from 1 to 18), which is the edge-to-edge dimension of each pad; the pad pitch (PAD_PP(i)) 48, which is the center-to-center dimension of each pad; and the pad coordinate (PAD X(i)) 49, which is the distance of a pad centerline from the (e.g., 50) to the side centerline 28.

The parameter PAD_G 52 is the minimum gap (edge-to-edge spacing of adjacent pads) dimension, and is essentially constant over the feature spread F. As known to those skilled in the art, there are various other manufacturing parameters which must be specified for the bond pads, but which are not shown in FIG. 3 to avoid confusion in the illustration. Such of these parameters as are necessary to the present method are described in Appendix A.

The PAD_W(i) and PAD_PP(i) values are directly related to: the manufacturing tolerances (MT) associated with the TAB lead-to-bond pad alignment, and the value of the spread feature size (F) and its (the ceramic package) standard variation shrinkage tolerance (PKG_SHR) (e.g., +/−1.0% F). The MT parameters include:
TAB lead width (TAB_W),
TAB lead width tolerance (TAB_WT),
TAB lead positional tolerance (TAB_PT),
TAB lead-to bond pad alignment tolerance (TAB_AT),
bond pad positional tolerance (PAD_PT),
bond pad width tolerance (PAD_WT), and
TAB lead overhang (TAB_OH) from the bond pad edge, expressed as a percent of TAB lead width.
The MT values are discussed in detail with respect to Appendix A.

Referring to Appendix A, Equation (1) defines the PAD_W(i) values in terms of the MT parameters, and the shrinkage variation tolerance. The TAB_AT, TAB_PT, PAD_PT and TAB_W*TAB_OH parameters are a +/− tolerance. Equation (1) treats the worst case requirements of PAD_W(i) by taking the absolute worst case of each +/−tolerance (i.e., 2x). The MT factor is a constant for a given package configuration.

The shrinkage tolerance factor, however, varies with pad placement; it varies as a function of PAD_X(i). Since PAD_X(i) (49, FIG. 3) is the distance of each pad centerline (50) from the center of symmetry, i.e. centerline (28, FIG. 3) of the bond pad shelf, PAD_X(i) is a minimum for the first pad from the centerline (note: if there are an odd number of bond pads per package side, the two half spread feature (F/2) regions will share the center pin, i.e. PAD_W(1)/2, and PAD_X(1)=0) the shrinkage tolerance for PAD_w(1) is zero, or near zero. PAD_W(1) then is essentially equal to MT. The shrinkage tolerance of the PAD_W(N) value at the feature spread extremity is obviously maximum.

Equation (2) defines PAD_X(i) as the sum of: ½ the present and preceding pad widths, the gap dimension (PAD_G), and the previous pad PAD_X(i) value. Equation (3) defines the PAD_PP value (48, FIG. 3) as the difference value between successive PAD_X(i) values. Equation (4) is obtained by substituting the term MT For the manufacturing tolerances, and Equation (2) for PAD_X(i) into Equation (1).

It should be noted that PAD_W(i) PAD_PP(i), and PAD_X(i) are the respective post-fired values for the pad widths, pad pitches, and pad coordinates. In order for the manufacturer to determine the corresponding pre-fired, or "green", values, the PAD_W(i), PAD_PP(i), and PAD_X(i) values must be magnified by the ceramic shrinkage value that the manufacturer anticipates. In the example of an 18% expected firing shrinkage, PAD_W(i), PAD_PP(i), and PAD_X(i) would be divided by the quantity (1.00−0.18),=0.82, to obtain the pre-fired values.

Appendix A, Sheet 2, lists the MT parameter values for an exemplary calculation of bond pad widths for a ceramic package having 144 pads (TAB_IO=144); an even number of pads per side (PKG_SYM=EVEN). This is 36 pads per full feature spread (F), or 18 pads per F/2 (PAD_N=18). As shown, the PAD_PP, PAD_W, and PAD_X values are variable, and determined by Equations (3), (4) and (2) respectively. Sheet 3 of Appendix A lists their calculated values. The pad closest the side centerline is listed as "18"; the extreme pad is "1".

As shown, the PAD_W values are only calculated for one half the total number of pads to be disposed on each side. The calculated array is then replicated for the remaining half of the side, and for each other half side on which pads are to be disposed It should be understood that the present method may be used to determine the PAD_W values of bond pads disposed in any surface area of the ceramic carrier; it is not limited to use on the carrier sides alone.

In the preferred embodiment of FIG. 3 the selected alignment point between the pads 22 and the leads 18 of die 14 was the center of symmetry 28 of the surface area on which the pads 22 are disposed. When installing the chip into the carrier this point is first aligned. The tolerances accommodated by this invention are based on shrinkage tolerance from this point. Selection of the center point is the most efficient use of the available space.

Figure 5:
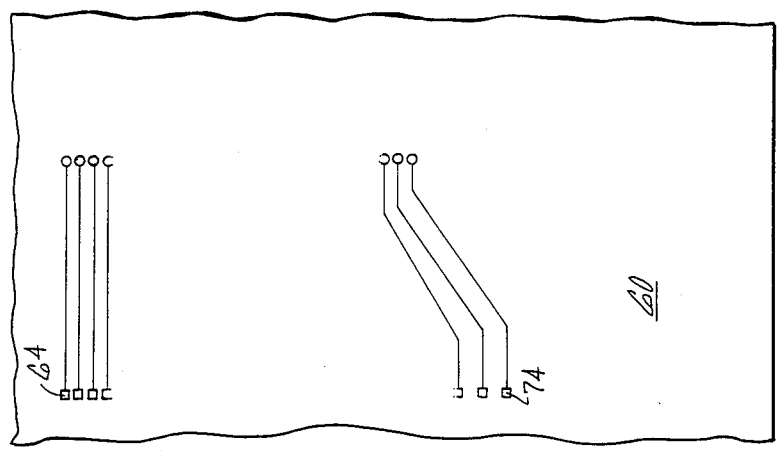
FIG. 5 is a plan view of a portion of a printed circuit board for connection with the carrier of FIG. 4.
Figure 4:
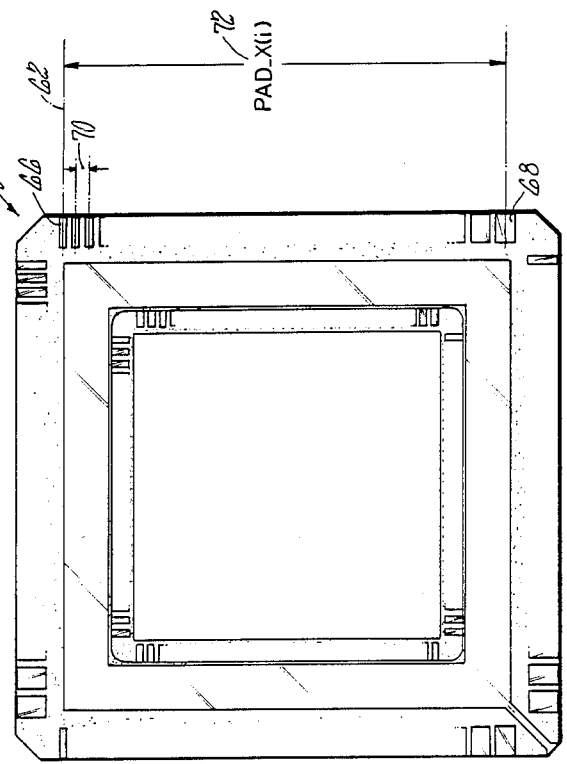
FIG. 4 is a plan view of an alternate embodiment illustrating the mounting relationship between an external electrical circuit module and the ceramic package.

The FIG. 4 and 5 embodiment illustrates application of the invention to an external electrical circuit module, which rather than a chip is a printed circuit board 60.

While a central alignment point is most efficient, an alternate location may be used where it facilitates later assembly. This is illustrated by the selection of alignment point 62 which is aligned with and overlays board pad 64 of 60 in later assembly.

The varying width of pads 66 through 68 are determined in the same manner as previously described. The pitch 70 and pad coordinates 72 also are determined in the same manner. The varying pitch is used for pads 64 to 74 on the printed circuit board, establishing them coincident with the nominal position of pads 66 through 68 after firing the ceramic.

The pads 66 through 68 are also located on the bottom side of chip carrier 10 whereby they may be directly soldered to corresponding pads of the printed circuit board.

Rather than a printed circuit board to which the ceramic package is attached, this electrical circuit module could alternately be a lead frame. Such a lead frame is etched from metal sheet and comprises a plurality of electrically parallel leads. Tie bars temporarily hold the leads in spaced relationship and are sheared after the lead frame leads are soldered or welded to the various units of the completed circuit.

Both the ceramic package and the electric circuit module have pads with variable pitch spacing. The pads of varying width may be located on either the ceramic package or electric circuit module as desired.

APPENDIX A

BOND PAD WIDTH (1) $PAD\_W(i) = \underbrace{2*TAB\_AT + 2*TAB\_PT + TAB\_W + TAB\_WT + 2*PAD\_PT + PAD\_WT - 2*TAB\_W * \frac{TAB\_OH}{100}}_{\text{MANUFACTURING TOLERANCES (MT) = CONSTANT}} + 2*0.01*PKG\_SHR*PAD\_X(i)$ WHERE:
- TAB_AT — TAB lead to package lead assembly alignment tolerance
- TAB_OH — Maximum TAB lead overhang from the package bond pad edge, in percent of TAB lead width
- TAB_PT — TAB lead positional tolerance
- TAB_W — Nominal TAB lead width
- TAB_WT — TAB lead width tolerance
- PAD_PT — Package bond pad positional tolerance
- PAD_WT — Package bond pad width tolerance
- PAD_X — Bond pad and TAB OLB coordinate from centerline
- PKG_SHR — Firing shrinkage tolerance of ceramic package (%)

(2) $PAD\_X(i) = PAD\_X(i-1) + 0.5*PAD\_W(i-1) + PAD\_G + 0.5*PAD\_W(i)$

WHERE: PAD_G — Nominal package bond pads gaps (3) $PAD\_PP = PAD\_X(i) - PAD\_X(i-1)$ Bond pad pitch, from the previous bond pad SUBSTITUTING(MT) and EQ(2) INTO EQ(1), and simplifying (4) $PAD\_W(i) = \frac{(MT)}{(1 - 0.01*PKG\_SHR)} + \frac{0.02*PKG\_SHR*(PAD\_X(i-1) + 0.5*PAD\_W(i-1) + PAD\_G)}{(1 - 0.01*PKG\_SHR)}$ FOLLOWING IS AN EXAMPLE OF CALCULATING THE BOND PAD WIDTHS USING EQ(4), TOGETHER WITH THE BOND PAD COORDINATE AND BOND PAD PITCH USING EQs (2), (3), FOR A 144 BOND PAD PACKAGE HAVING THE FOLLOWING PARAMETERS.

TAB OLB AND PACKAGE PARAMETERS (SPECIFIED):

TAB PARAMETERS (SPECIFIED)

| | | |
|---|---|---|
| TAB_IO | Total number TAB leads and internal package bond pads | 144 |
| TAB_AT | TAB lead to package lead assembly alignment tolerance | 0.0002 |
| TAB_OH | Maximum TAB lead overhang from the package bond pad edge, in percent of TAB lead width | 25.0000% |
| TAB_PT | TAB lead positional tolerance | 0.0002 |
| TAB_W | Nominal TAB lead width | 0.0040 |
| TAB_WT | TAB lead width tolerance | 0.0002 |

PACKAGE INTERNAL BOND PAD PARAMETERS (SPECIFIED):

| | | |
|---|---|---|
| PAD_G | Nominal package bond pads gaps | 0.0058 |
| PAD_PT | Package bond pad positional tolerance | 0.0005 |
| PAD_WT | Package bond pad width tolerance | 0.0010 |

PACKAGE BOND PAD PATTERN PARAMETERS (CALCULATED):

| | | |
|---|---|---|
| PAD_N | Integer number of package bond pads per ½ bond pad shelf width | 18 |
| PAD_PP | Bond pad pitch, from the previous bond pad | variable |
| PAD_W | Bond pad width | variable |
| PAD_X | Bond pad and TAB OLB coordinate from centerline | variable |
| PKG_SYM | Bond pad row symetry, even or odd | EVEN |

THE CALCULATED PAD_W, PAD_PP, AND PAD_X ARE LISTED

APPENDIX A-continued

BELOW FOR ONE HALF OF ONE SIDE OF THE PACKAGE
(⅛th OF 144 PIN TOTAL). THE BOND PAD
PATTERN IS REPLICATED EIGHT TIMES
(FIRED) PACKAGE OUTER LEAD BOND PADS (8 FOLD SYMMETRY)
FOR TAB APPLICATIONS

| (pad #) | PAD_W WIDTH (inches) | PAD_PP PITCH (REF) (inches) | PAD_X COORDINATE (inches) |
|---|---|---|---|
| 18 | 0.0051 | 0.0054 | 0.0054 |
| 17 | 0.0053 | 0.0110 | 0.0164 |
| 16 | 0.0056 | 0.0112 | 0.0276 |
| 15 | 0.0058 | 0.0114 | 0.0390 |
| 14 | 0.0060 | 0.0116 | 0.0506 |
| 13 | 0.0063 | 0.0119 | 0.0625 |
| 12 | 0.0065 | 0.0121 | 0.0747 |
| 11 | 0.0067 | 0.0124 | 0.0870 |
| 10 | 0.0070 | 0.0126 | 0.0996 |
| 9 | 0.0073 | 0.0129 | 0.1125 |
| 8 | 0.0075 | 0.0131 | 0.1256 |
| 7 | 0.0078 | 0.0134 | 0.1390 |
| 6 | 0.0081 | 0.0137 | 0.1527 |
| 5 | 0.0083 | 0.0139 | 0.1666 |
| 4 | 0.0086 | 0.0142 | 0.1809 |
| 3 | 0.0089 | 0.0145 | 0.1954 |
| 2 | 0.0092 | 0.0148 | 0.2102 |
| 1 | 0.0095 | 0.0151 | 0.2253 |

I claim:

1. A ceramic package comprising:
a ceramic substrate of ceramic having a shrinkage tolerance during firing;
a plurality of spaced bond pads for registration with an electric circuit module;
a selected alignment point associated with said bond pads;
said bond pads having varying widths increasing incrementally from a minimum width adjacent to said alignment point through a plurality of spaced pads beyond the pad closest to said alignment point to a maximum width for the pad located furthest from said alignment point.

2. A ceramic package as in claim 1:
said plurality of spaced pads located with substantially equal spacing between adjacent edges of adjacent pads.

3. A ceramic package as in claim 1:
said selected alignment point being at the center of said plurality of spaced bond pads.

4. A ceramic package as in claim 1:
said selected alignment point being at the center of said plurality of spaced bond pads.

5. A ceramic package and electric circuit module comprising:
a ceramic package including a substrate of ceramic having a shrinkage tolerance during firing;
a plurality of spaced bond pads on said ceramic packaging;
a plurality of spaced bond pads on said electric circuit module for registration with said bond pads on said ceramic package;
a selected alignment point associated with each of said plurality of bond pads;
one of said plurality of bond pads having varying widths increasing incrementally from a minimum width adjacent to said alignment point through a plurality of spaced pads beyond the pad closest to said alignment point to a maximum width for the pad located furthest from said alignment point.

6. A ceramic package and electric circuit module as in claim 5:
said one of said plurality of spaced pads located with substantially equal spacing between adjacent edges of adjacent pads.

7. A ceramic package and electric circuit module as in claim 6:
said selected alignment point being at the center of each of said plurality of spaced bond pads.

* * * * *